(12) United States Patent  (10) Patent No.: US 7,430,726 B2
Dewan  (45) Date of Patent: Sep. 30, 2008

(54) SYSTEM FOR DELAY REDUCTION DURING TECHNOLOGY MAPPING IN FPGA

(75) Inventor: Hitanshu Dewan, Delhi (IN)

(73) Assignee: Sicronic Remote KG, LLC, Wilmington, DE (US)

( * ) Notice: Subject to any disclaimer, the term of this patent is extended or adjusted under 35 U.S.C. 154(b) by 454 days.

(21) Appl. No.: 11/027,292

(22) Filed: Dec. 30, 2004

(65) Prior Publication Data

US 2005/0177808 A1    Aug. 11, 2005

(30) Foreign Application Priority Data

Dec. 30, 2003   (IN)   .................. 1645/DEL/2003

(51) Int. Cl.
    *G06F 17/50*   (2006.01)
(52) U.S. Cl. ............................ 716/2; 716/18
(58) Field of Classification Search ............ 716/2, 716/18
    See application file for complete search history.

(56) References Cited

U.S. PATENT DOCUMENTS 6,546,539 B1* 4/2003 Lu et al. .................... 716/12
6,557,144 B1* 4/2003 Lu et al. ..................... 716/2
7,219,048 B1* 5/2007 Xu ............................ 703/19
7,257,800 B1* 8/2007 Singh et al. ............... 716/16

OTHER PUBLICATIONS

K.N.Chen et al., "A New Strategy of Performance-Directed Technology Mapping Algorithm for LUT-Based FPGAs," 1996 IEEE Int'l Symposium on Circuits and Systems, pp. 822-825.*
R.J.Francis et al., Technology Mapping of Lookup Table-Based FPGAs for Performance, 1991 IEEE Int'l Conference on CAD, pp. 568-571.*

* cited by examiner

*Primary Examiner*—Stacy A Whitmore

(57) ABSTRACT

The present invention relates to a system for reducing the delay during technology mapping in FPGA that comprises locating and replicating the critical fan-in nodes in the mapping logic. Parallel computation is performed on the replicated nodes followed by selection of the output. The delay reduction approach in the present invention gives a highly efficient logic implementation when delay is the prime concern and area can be afforded to be expanded. The technique relies on replicating logic and performing parallel computation on delay critical LUT's.

48 Claims, 3 Drawing Sheets

SYSTEM FOR DELAY REDUCTION DURING TECHNOLOGY MAPPING IN FPGA

PRIORITY CLAIM

This application claims priority from Indian patent application No. 1645/Del/2003, filed Dec. 30, 2003, which is incorporated herein by reference.

TECHNICAL FIELD

Embodiments of the present invention relate to delays incurred during technology mapping in FPGAs. In particular, embodiments of the invention relate to reducing the delay incurred during technology mapping in FPGAs.

BACKGROUND

A FPGA is a programmable logic device with uncommitted logic and routing elements. The implementation of logic consists of mapping the logic into Look Up Tables (LUT's) and LUT's into Programmable Logic Blocks (PLB's). The circuit netlist at the gate level is first packed into k input LUT's as available in the PLB architecture. The circuit behavior is also important to be analyzed in terms of the delay that under the unit delay model is the maximum sum of the delays of LUT's in series, by assigning a delay of unity to each of them. The job of the mapper is to map the given logic into as few LUT's as possible.

Various techniques exist for mapping a given logic into FPGA. The focus in all such mapping techniques is to optimize the delay or area as the user may require. Various delay optimization algorithms exist which try to reduce the critical path length under the unit delay model trading off the area to some extent. As delay is an important consideration on only the critical path, algorithms like Flowmap-r have been developed which focus on the delay reduction only on the critical path, focusing on area optimization on the rest.

The objective of the mapping process is to consume as few LUT's as possible, but that is achievable to some extent.

FIG. 1 illustrates the flow diagram of the FPGA development process and role of the technology mapping in it. 1.1 in the figure indicates the Design Entry as entering the design into the system for hardware realization of the design. Logic Synthesis 1.2 performs the hardware realization of the design entered depending on the target device. The optimized netlist is then mapped into LUT as shown in the 1.3 that is followed by Placement and Route function as in block 1.4. This block implements the positioning and configuration of the interconnects of the logic blocks. The bit stream is generated as in the Device programming unit block 1.5 for configuring the target device. 1.6 illustrates the configured target device after the completion of the design cycle.

FIG. 2 illustrates the diagram of a prior art method for mapping logic/technology in an FPGA. The circular nodes (a-m) represent a logic for two input LUT's. It is evident from the figure that the path from nodes a and b to k is quite long as compared to the path through c, d and e. As a result the signal generation at k has to wait for the signal from a through i. This makes the path a, n, f, i, j as a critical path leading to a critical fan-in node k. A critical path in a circuit is a chain of circuit elements or the longest path such that the signal takes the maximum time to reach the final output through that given path. In most of the cases, nodes (LUTs) falling in the critical path have one or more fan-ins which are critical (have the maximum delay) while the rest of the input take lesser time so are not that critical. This essentially means that a signal at the output of node cannot be generated till all the input signals arrive, in other words non-critical signals have to wait for signals on the critical path. This is what essentially gives rise to a critical path for the whole circuit.

Therefore, it is realized to be essential to provide a scheme to reduce the delay incurred during the technology mapping in an FPGA. Embodiments of the present invention provide such a scheme.

SUMMARY

Embodiments of the present invention obviate the shortcomings of the prior art and provide a method for delay reduction during technology mapping in an FPGA.

Embodiments of the invention identify the critical path for LUT mapping.

Other embodiments of the invention replicate the logic of the critical fan-in nodes falling in the critical path.

Yet other embodiments of the invention perform parallel computation on the replicated logic nodes so as to reduce the mapping delay.

According to one embodiment of the present invention, an improved system for delay reduction during technology mapping in FPGA includes:

Critical Path Identifier (CPI) for locating critical fan-in nodes in the mapping logic, wherein, Logic Replicator (LR) for replicating logic for the critical fan-in nodes, Parallel Computer (PC) for performing parallel computation on the critical fan-in nodes and non critical signals, Output Selector (OS) for selecting the output at the last critical fan-in node after performing parallel computation.

According to another embodiment of the present invention, an improved method for delay reduction during technology mapping in FPGA includes:

locating critical fan-in nodes in the mapping logic using Critical Path Identifier (CPI), wherein, replicating logic for the critical fan-in nodes using Logic Replicator (LR), performing parallel computation on the critical fan-in nodes and non critical signals using Parallel Computer (PC), selecting the output at the last critical fan-in node after performing parallel computation using Output Selector (OS), thereby reducing delay in the technology mapping in an FPGA.

According to another embodiment of the present invention, the CPI determines the fan-in nodes that constitute the greatest delay/critical path.

According to another embodiment of the present invention, the LR duplicates the critical fan-in nodes.

According to another embodiment of the present invention, the PC performs look ahead logic computation.

According to another embodiment of the present invention, the output selector is a multiplexer.

The greatest delay path may be a chain of logic elements that require the maximum time for logic execution in the FPGA.

The LR may assign complimentary values to each pair of duplicated nodes.

The PC may locate the input of a critical node and perform parallel computation to reduce the delay of the node.

The critical fan-in nodes may be subjected to parallel computation for logic mapping into Look Up Table's (LUT's).

According to another embodiment of the present invention, a computer program product comprising computer readable program code stored on computer readable storage medium embodied therein for providing a system for delay reduction during technology mapping in FPGA includes:
a. Critical Path Identifier (CPI) for locating critical fan-in nodes in the mapping logic, wherein,
b. Logic Replicator (LR) for creating replicating logic for the critical fan-in nodes,
c. Parallel Computer (PC) for performing parallel computation on the critical fan-in nodes and non critical signals,
d. Output Selector (OS) for selecting the output at the last critical fan- in node after performing parallel computation.

Embodiments of the invention will now be described with reference to the accompanying drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
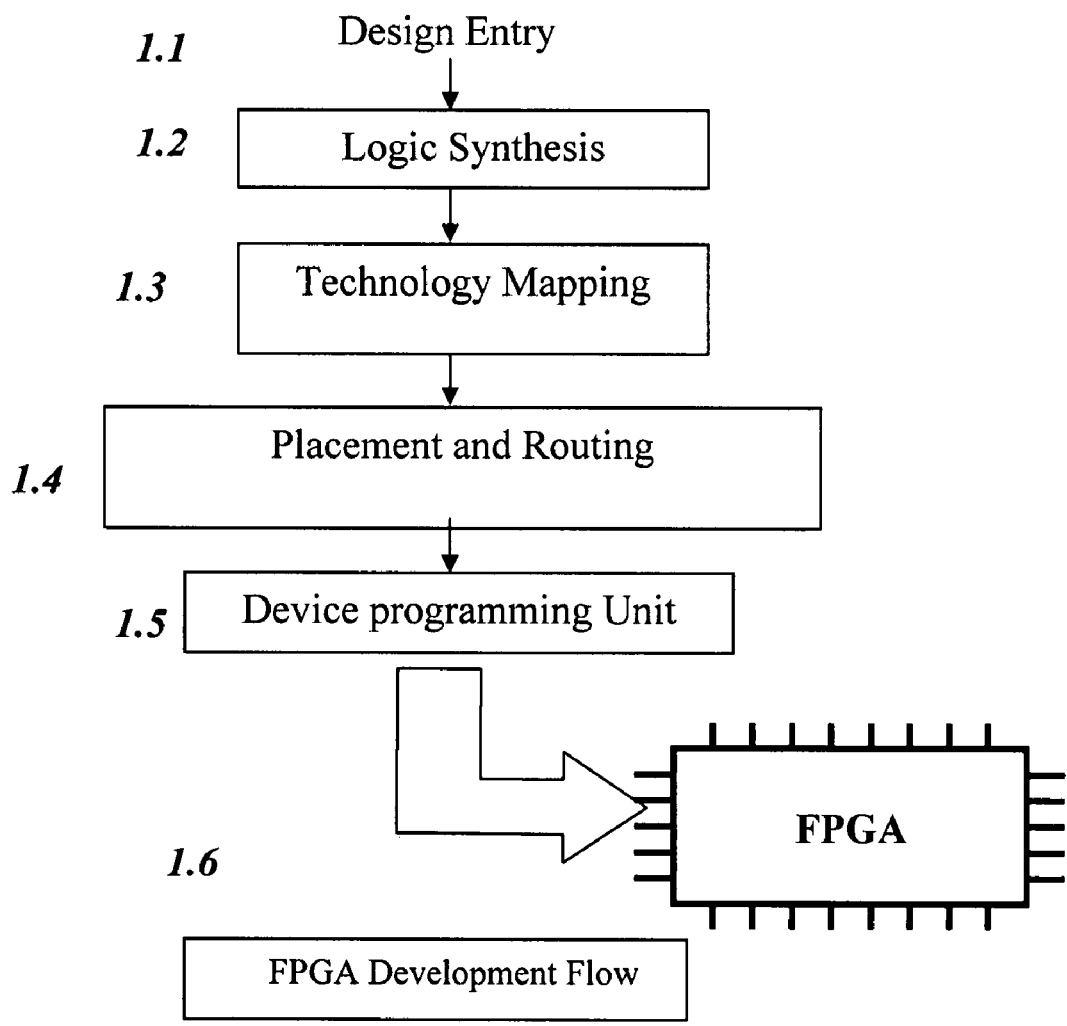
FIG. 1 illustrates the flow diagram of the FPGA development process and role of technology mapping in it.
Figure 2:
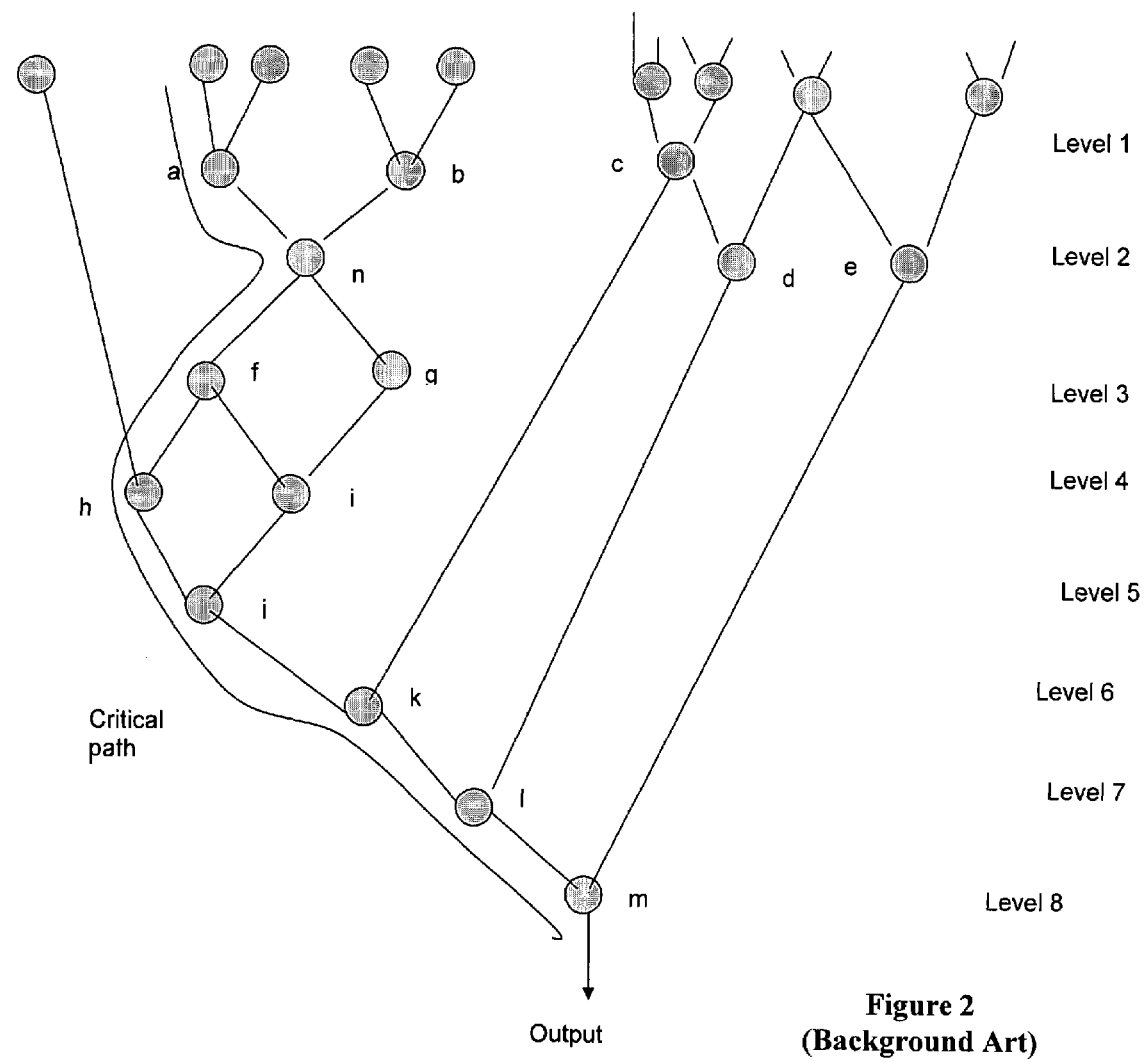
FIG. 2 illustrates the prior art method used for technology mapping in an FPGA.

FIG. 1 is a flow diagram of the FPGA development process and FIG. 2 illustrates a prior art method for technology mapping as described under the heading 'Background of the Invention'.

Figure 3:
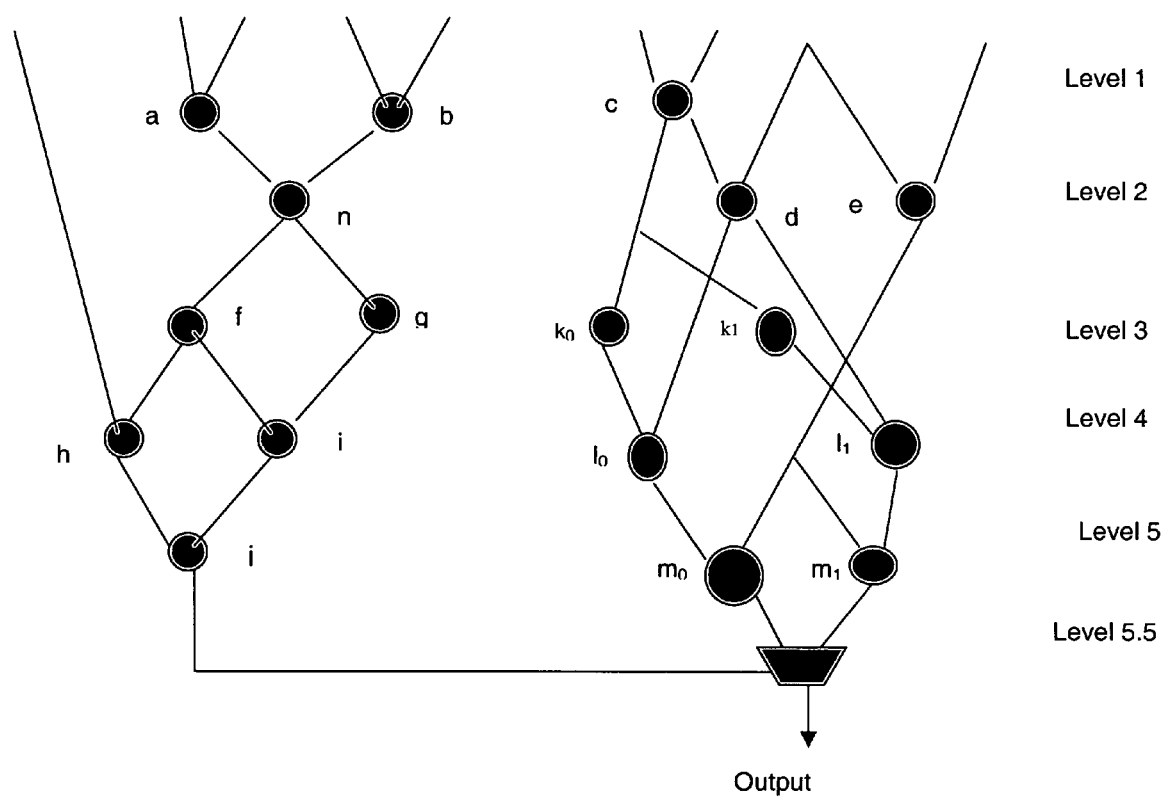
FIG. 3 illustrates a flow diagram according to one embodiment of the present invention.
Figure 2:
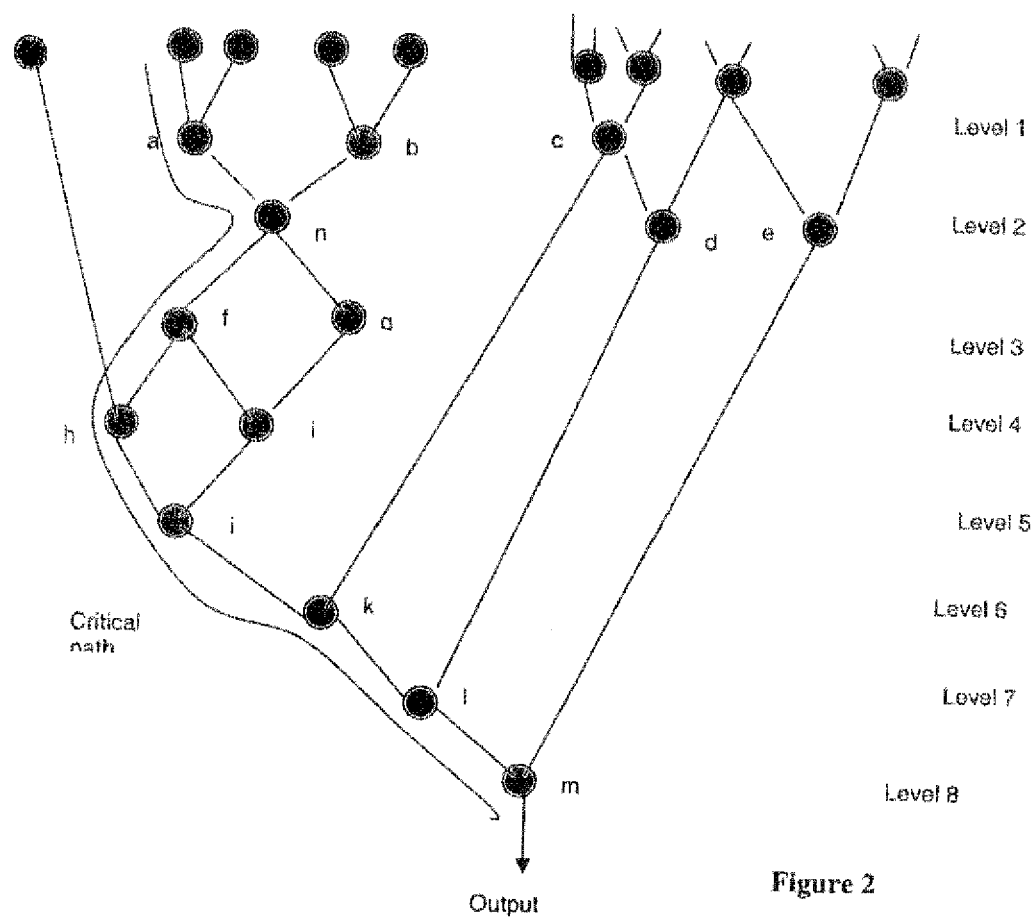
Figure 3:
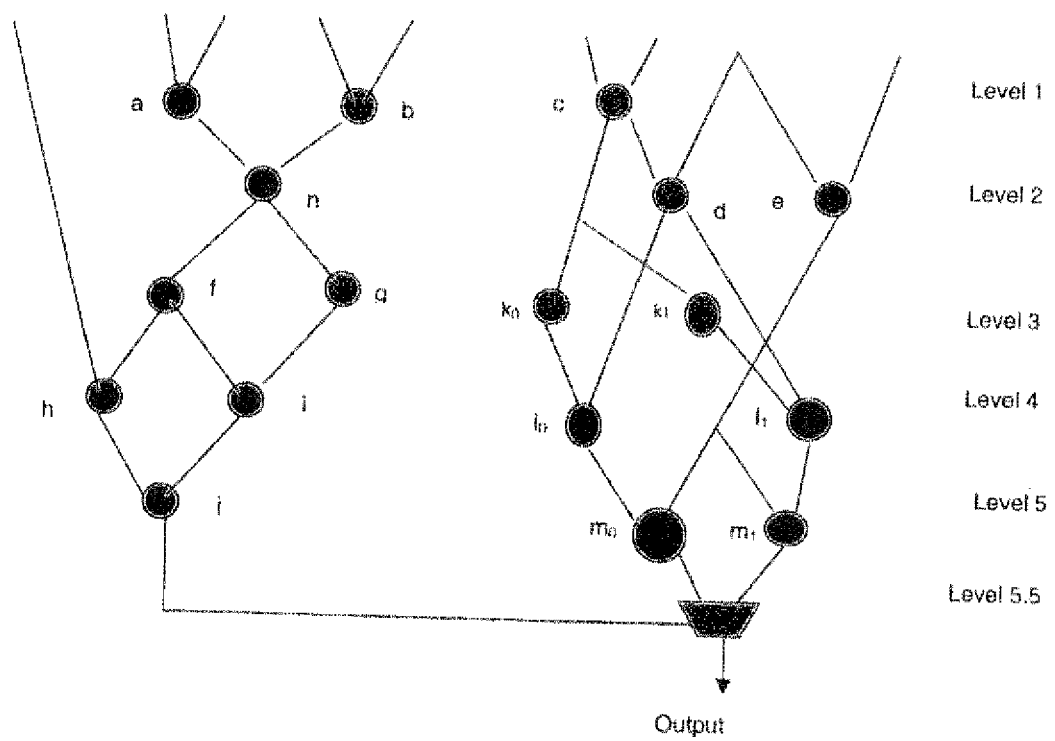

FIG. 3 is a flow diagram according to one embodiment of the present invention with reference to the prior art in FIG. 1. Here the node k is the first critical fan-in node, followed by the nodes l & m. Here the nodes k, l & m are replicated for parallel computation to obviate the critical path for minimizing the delay. The critical path in this case is defined with reference to FIG. 2 and is constituted by the nodes a, f, h, j, k, l & m.

The nodes k0 and k1 assume the critical input j as 0 or 1, so that there occurs a reduction in their overall criticality.

Look Ahead Computation is performed parallel to the computation of the path constituted by the nodes a, n, f, i, j, in which the replicated nodes are formed as the images of the critical nodes, thus making them independent of the critical input j, which is being simultaneously computed. The term Look-ahead computation is used since we are assuming critical inputs for the nodes that are subjected to computation after the computation on the non-critical nodes.

The Look-ahead parallel computation for the critical fan-in nodes and the non-critical signals is depicted by Levels 1-5.5 in the diagram. The replicating logic for parallel computation is depicted in the Levels 3 to 5 followed by the using a multiplexer (Level 5.5) to select the final output obtained after the replicated logic. It can be observed from the Figure that there is a significant reduction in the number of Levels of the mapping as compared to the prior art in FIG. 2.

It is observed in FIG. 3 of the present invention, that the area increment can be observed to be of the order of 13% and the delay decrement is of the order of 31%. It should be noted that as the logic becomes big, this trade-off between area and delay increases substantially. It is also observed that an increment of 4-8 LUTs if brings a delay decrement of 10-20%, which is substantial.

Increasing the number of LUTs in a design to be mapped, delay in mapping could be reduced substantially so as to overcome the drawback of LUT consumption in speed critical circuits.

The difference in the delay values between critical and non-critical nodes depends on the amount of logic we can replicate. Thus, we can significantly reduce the bottleneck of the critical path, by performing replication followed by parallel computation logic.

An FPGA including a system for reducing delay as described above may be utilized in a variety of different types of electronic systems. For example, multiple FPGAs may be contained in development modules utilized during the design of many types of electronic systems.

From the foregoing it will be appreciated that, although specific embodiments of the invention have been described herein for purposes of illustration, various modifications may be made without deviating from the spirit and scope of the invention.

We claim:

1. A system for delay reduction during technology mapping in an FPGA, the system comprising:
   a Critical Path Identifier for locating critical fan-in nodes in the mapping logic of the FPGA;
   a Logic Replicator for creating replicating logic for the critical fan-in nodes;
   a Parallel Computer for performing parallel computation on the critical fan-in nodes and on non-critical nodes in the mapping logic; and
   an Output Selector for selecting the output at the last critical fan-in node after performing the parallel computation.

2. The system as claimed in claim 1, wherein said Critical Path Identifier determines fan-in nodes that constitute a greatest delay path.

3. The system as claimed in claim 2, wherein said greatest delay path is a chain of logic elements that use a maximum time for logic execution in the FPGA.

4. The system as claimed in claim 1, wherein said Logic Replicator duplicates the critical fan-in nodes.

5. The system as claimed in claim 4, wherein the Logic Replicator duplicates the critical fan-in nodes by creating a pair of duplicated critical fan-in nodes and wherein said Logic Replicator assigns complimentary values to the critical fan-in nodes in each pair of duplicated nodes.

6. The system as claimed in claim 1, wherein said Parallel Computer performs look ahead logic computation.

7. The system as claimed in claim 6, wherein said Parallel Computer locates an input of a critical fan-in node and performs parallel computation to reduce delay of the critical fan-in node.

8. The system as claimed in claim 1, wherein said Output Selector is a multiplexer.

9. The system as claimed in claim 1, wherein said critical fan-in nodes are subjected to parallel computation for logic mapping into Look Up Tables (LUTs).

10. A method for delay reduction during technology mapping in an FPGA, the method comprising:
   locating critical fan-in nodes in the mapping logic using Critical Path Identifier (CPI);
   creating replicating logic for the critical fan-in nodes using Logic Replicator (LR);

performing parallel computation on the critical fan-in nodes and on non critical nodes in the mapping logic using a Parallel Computer (PC); and selecting an output at a last critical fan-in node after performing parallel computation using Output Selector.

11. The method as claimed in claim 10, wherein said CPI determines fan-in nodes that constitute a greatest delay path.

12. The method as claimed in claim 11, wherein said greatest delay path is a chain of logic elements that use a maximum time for logic execution in the FPGA.

13. The method as claimed in claim 10, wherein said LR duplicates the critical fan-in nodes.

14. The method as claimed in claim 13, wherein the LR duplicates the critical fan-in nodes by creating a pair of duplicated critical fan-in nodes and wherein said LR assigns complimentary values to the critical fan-in nodes in each pair of duplicated nodes.

15. The method as claimed in claim 10, wherein said PC performs look ahead logic computation.

16. The method as claimed in claim 15, wherein said PC locates an input of a critical fan-in node and performs parallel computation to reduce delay of the critical fan-in node.

17. The method as claimed in claim 10, wherein said output selector is a multiplexer.

18. The method as claimed in claim 10, wherein said critical fan-in nodes are subjected to parallel computation for logic mapping into Look Up Tables (LUTs).

19. A computer program product comprising computer readable program code stored on computer readable storage medium embodied therein for providing a system for delay reduction during technology mapping in an FPGA, the system comprising:

a Critical Path Identifier for locating critical fan-in nodes in mapping logic;

a Logic Replicator for creating replicating logic for the critical fan-in nodes;

a Parallel Computer for performing parallel computation on the critical fan-in nodes and on non critical nodes in the mapping logic; and an Output Selector for selecting an output at a last critical fan-in-node after performing parallel computation.

20. The computer program product as claimed in claim 19, wherein said Critical Path Identifier determines fan-in nodes that constitute a greatest delay path.

21. The computer program product as claimed in claim 20, wherein said greatest delay path is a chain of logic elements that use a maximum time for logic execution in the FPGA.

22. The computer program product as claimed in claim 19, wherein said Logic Replicator duplicates the critical fan-in nodes.

23. The computer program product as claimed in claim 22, wherein the Logic Replicator duplicates the critical fan-in nodes by creating a pair of duplicated critical fan-in nodes and wherein said Logic Replicator assigns complimentary values to the critical fan-in nodes in each pair of duplicated nodes.

24. The computer program product as claimed in claim 19, wherein said Parallel Computer performs look ahead logic computation.

25. The computer program product as claimed in claim 24, wherein said Parallel Computer locates an input of a critical fan-in node and performs parallel computation to reduce delay of the critical fan-in node.

26. The computer program product as claimed in claim 19, wherein said Output Selector is a multiplexer.

27. The computer program product as claimed in claim 19, wherein said critical fan-in nodes are subjected to parallel computation for logic mapping into Look Up Tables (LUTs).

28. A method for delay reduction during programming of an FPGA, comprising:

identifying critical path fan-in nodes in the mapping logic;

for each critical path fan-in node, creating a first replicated logic path for each logic path dependent upon a value of the critical path fan-in node, the first replicated logic path assuming a first value of the critical path fan-in node, creating a second replicated logic path for each logic path dependent upon a value of the critical path fan-in node, the second replicated logic path assuming a second value of the critical path fan-in node;

determining output values from the first and second replicated logic paths;

determining an actual value for the critical path fan-in node; and selecting the output value from either the first or second replicated logic path in response to the actual value determined for the critical path fan-in node.

29. The method of claim 28 wherein identifying critical path fan-in nodes comprises identifying fan-in nodes that have a greatest delay through the FPGA.

30. The method of claim 29 wherein the greatest delay is defined by a chain of logic elements in the FPGA that use a maximum time for logic execution in the FPGA.

31. The method of claim 28 wherein creating a first replicated logic path comprises duplicating logic downstream of the critical path fan-in node and assigning the first value to the value of the critical path fan-in node.

32. The method of claim 31 wherein creating a second replicated logic path comprises duplicating logic downstream of the critical path fan-in node and assigning the second value to the value of the critical path fan-in node.

33. The method of claim 28 wherein the first and second assumed values of the critical path fan-in node are complimentary logic values.

34. The method of claim 28 wherein determining output values from the first and second replicated logic paths comprises determining these output values in parallel with determining the actual value for the critical path fan-in node.

35. A system for delay reduction in an FPGA, the system comprising:

an identification component operable to determine from a plurality of fan-in nodes in the FPGA, which ones of these fan-in nodes are critical pat fan-in nodes;

a replication component operable for each determined critical path fan-in node to create replicated logic paths for logic paths dependent upon a value of that critical path fan-in node, each replicated logic path assigning a value to the critical path fan-in node;

a computation component operable for each critical path fan-in node to calculate an output value for each replicated logic path created for that critical path fan-in node and operable to calculate an actual value for that critical path fan-in node; and a selection component operable responsive to the actual value calculated for each critical path fan-in node to output one of the output values from the replicated logic paths created for that critical path fan-in node.

36. The system of claim 35 wherein the selection component comprises a multiplexer.

37. The system of claim 35 wherein the computation component is operable for each critical path fan-in node to compute the output values from the replicated logic paths created for that critical path fan-in node prior to calculating the actual value for that critical path fan-in node.

38. The system of claim 35 wherein the identification component determines whether a given fan-in node is a critical path fan-in node when a chain of logic elements in the FPGA that provides an input to that critical path fan-in node uses a maximum time for logic execution in the FPGA.

39. An electronic system, comprising:
- an electronic subsystem including an FPGA and including a system reducing a computational delay in the FPGA, the system comprising,
  - an identification component operable to determine from a plurality of fan-in nodes in the FPGA which ones of these fan-in nodes are critical path fan-in nodes;
  - a replication component operable for each determined critical path fan-in node to create replicated logic paths for logic paths dependent upon a value of that critical path fan-in node, each replicated logic path assigning a value to the critical path fan-in node;
  - a computation component operable for each critical path fan-in node to calculate an output value for each replicated logic path created for that critical path fan-in node and operable to calculate an actual value for that critical path fan-in node; and
  - a selection component operable responsive to the actual value calculated for each critical path fan-in node to output one of the output values from the replicated logic paths created for that critical path fan-in node.

40. The electronic system of claim 39 wherein the electronic subsystem comprises a development module.

41. The electronic system as claimed in claim 39, wherein said identification component determines fan-in nodes that constitute a greatest delay path.

42. The electronic system as claimed in claim 41, wherein said greatest delay path is a chain of logic elements that use a maximum time for logic execution in the FPGA.

43. The electronic system as claimed in claim 39 wherein said replication component duplicates the critical fan-in nodes.

44. The electronic system as claimed in claim 43, wherein the replication component duplicates the critical fan-in nodes by creating a pair of duplicated critical fan-in nodes and wherein said replication component assigns complimentary values to the critical fan-in nodes in each pair of duplicated nodes.

45. The electronic system as claimed in claim 39, wherein said computation component performs look ahead logic computation.

46. The electronic system as claimed in claim 45, wherein said computation component locates an input of a critical fan-in node and performs parallel computation to reduce delay of the critical fan-in node.

47. The electronic system as claimed in claim 39, wherein said selection component is a multiplexer.

48. The electronic system as claimed in claim 39, wherein said critical fan-in nodes are subjected to parallel computation for logic mapping into Look Up Tables (LUTs).

* * * * *

UNITED STATES PATENT AND TRADEMARK OFFICE
CERTIFICATE OF CORRECTION

PATENT NO. : 7,430,726 B2  Page 1 of 3
APPLICATION NO. : 11/027292
DATED : September 30, 2008
INVENTOR(S) : Dewan It is certified that error appears in the above-identified patent and that said Letters Patent is hereby corrected as shown below:

The sheet of drawings consisting of figures 2 and 3 should be deleted to appear as per attached figures 2 and figure 3.

On Sheet 3 of 3, in FIG. 3, (Left hand side of Level 5), line 5, delete "i" and insert -- j --, therefor.

In column 3, line 14, delete "fan- in" and insert -- fan-in --, therefor.

In column 3, lines 14-15, below "computation." insert -- BRIEF DESCRIPTION OF THE DRAWINGS --.

In column 4, line 33, in Claim 1, delete "non-critical" and insert -- non critical --, therefor.

In column 5, line 41, in Claim 19, delete "fan-in-node" and insert -- fan-in node --, therefor.

In column 6, line 46, in Claim 35, delete "pat" and insert -- path --, therefor.

In column 8, line 7, in Claim 43, after "39" insert -- , --.

Signed and Sealed this

Twenty-second Day of December, 2009

David J. Kappos
*Director of the United States Patent and Trademark Office*